United States Patent
Habuka et al.

[11] Patent Number: 6,124,209
[45] Date of Patent: Sep. 26, 2000

[54] METHOD FOR TREATING A SURFACE OF A SILICON SINGLE CRYSTAL AND A METHOD FOR MANUFACTURING A SILICON SINGLE CRYSTAL THIN FILM

[75] Inventors: Hitoshi Habuka; Toru Otsuka, both of Annaka, Japan

[73] Assignee: Shin-Etsu Handotai Co., Ltd., Tokyo, Japan

[21] Appl. No.: 08/988,538

[22] Filed: Dec. 10, 1997

[30] Foreign Application Priority Data

Dec. 16, 1996 [JP] Japan .................................. 8-353171

[51] Int. Cl.[7] .................................................. H01L 21/00
[52] U.S. Cl. ......................... 438/706; 438/906; 134/1.3; 117/89; 117/102; 117/91; 117/935
[58] Field of Search .................... 438/706, 906; 134/1.3; 117/89, 102, 935, 91

[56] References Cited

U.S. PATENT DOCUMENTS

| 5,022,961 | 6/1991 | Izumi et al. |
| 5,365,877 | 11/1994 | Kubota. |
| 5,403,434 | 4/1995 | Moslehi. |
| 5,489,557 | 2/1996 | Jolley ............................. 134/3 |
| 5,846,321 | 12/1998 | Habuka et al. .................. 117/102 |
| 5,880,031 | 3/1999 | Wong ............................. 438/706 |

FOREIGN PATENT DOCUMENTS 0 746 011 A2  4/1996  European Pat. Off. .

OTHER PUBLICATIONS

Abstract, XP000422360, Vermuelen et al., Oct. 1993, A HF Vapor Etch Process for Integration in Cluster–Tool Processes: Characteristics and Applications Netherlands.

*Primary Examiner*—Robert Kunemund
*Attorney, Agent, or Firm*—Snider & Associates; Ronald R. Snider

[57] ABSTRACT

The surface of a silicon single crystal substrate 2 is exposed to a mixed gas of hydrogen fluoride gas and hydrogen gas at 0° C.–100° C. to remove a natural oxide film 3 formed on the surface of silicon single crystal substrate 2. The method, as a pre-treatment to the formation of a silicon single crystal thin film, gives a smooth surface with a low temperature treatment and without causing the out-diffusion of the dopants or the auto-doping phenomenon.

4 Claims, 1 Drawing Sheet

METHOD FOR TREATING A SURFACE OF A SILICON SINGLE CRYSTAL AND A METHOD FOR MANUFACTURING A SILICON SINGLE CRYSTAL THIN FILM

RELATED APPLICATION

This application claims the priority of Japanese Patent application No. 8-353171 filed on Dec. 16, 1996, which is incorporeted herein by reference.

BACKGROUND OF THE INVENTION

1. Field of the Invention

This invention relates in general to a method for treating a surface of a silicon single crystal and a method for manufacturing a silicon single crystal thin film, and more particularly to a method for removing the natural oxide film formed on the surface of a silicon single crystal before growing a silicon single crystal thin film and such on the silicon single crystal.

2. The prior Art

A silicon dioxide film with a thickness of 10–15 angstroms is generally formed as a natural oxide filem on the surface of a silicon single crystal substrate used for manufacturing semiconductor devices. When growing a silicon single crystal thin film and such on this silicon single crystal substrate, it is indispensable to remove the natural oxide film beforehand. If the natural oxide film is left on the surface, then the information about the crystal axis of the silicon single crystal substrate is hidden. Therefore, when a silicon single crystal thin film is grown on the silicon single crystal substrate by means of, for example, vapor phase epitaxial growth without removing the natural oxide film, then the crystallinity of the silicon single crystal thin film cannot be maintained.

Conventionally, methods used to remove the natural oxide film formed on the surface of a silicon single crystal substrate include a method in which a silicon single crystal substrate is heated up to about 1100° C. and held in hydrogen gas to reduce the natural oxide film and a method in which it is also held in a high temperature environment and hydrogen chloride gas is fed to remove the natural oxide film along with silicon on the substrate surface. Also proposed is a method in which a treatment is conducted similarly at a high temperature using hydrogen fluoride gas which has the same effect on silicon as does hydrogen chloride.

On the other hand, a method which has been proposed for the removal of the natural oxide film without heating the silicon single crystal substrate comprises use of a three-ingredient mixed gas of hydrogen fluoride gas, nitrogen gas and water vapor or a three-ingredient mixed gas of hydrogen fluoride gas, nitrogen gas and alcohol vapor to convert the natural oxide film into silicon tetra fluoride for removal.

However, of these methods, the methods in which the treatment is conducted at a high temperature above 1100° C. may cause out-diffusion of the dopant such as boron to vaporize it from the silicon single crystal substrate, thus disrupting the dopant distribution in the cross-sectional direction of the silicon single crystal substrate. In this case, a layer with a reduced dopant concentration is formed from the surface to a depth of approximately 1 micrometer, and also a so-called auto-doping phenomenon occurs, frequently resulting in a dopant concentration in the direction of the diameter of the silicon single crystal thin film which is different from the intended value.

Further, the method described above etches the silicon single crystal along with the natural oxide film and, as a result, the surface of the silicon single crystal substrate becomes uneven after the removal of the natural oxide film, and the surface condition may not be appropriate for conducting the gas phase growth of a silicon single crystal thin film and such.

On the other hand, for the methods which use a mixed gas of hydrogen fluoride gas, nitrogen gas and water vapor or a mixed gas of hydrogen fluoride gas, nitrogen gas and alcohol vapor, hydrogen fluoride gas severely etches the silicon surface and unevenness may be formed on the surface of the silicon single crystal substrate in the same manner as described above. The primary reason for this is because water vapor or alcohol vapor which is added to accelerate the removal of the natural oxide film significantly increases the corrosiveness of hydrogen fluoride gas.

Therefore, a method which uses a mixed gas with hydrogen fluoride anhydride is also investigated. In this case, although the removal of the natural oxide film does proceed, there are problems in reproducibility and the stability of the removal rate and the yield is low, making it unsuitable as an industrial process.

BRIEF SUMMARY OF THE INVENTION

The present invention is conducted in view of the aforementioned conventional problems and the object is to provide a method for treating a surface of a silicon single crystal which gives a smooth surface without the need for a high temperature treatment and without causing the out-diffusion of the dopants or the auto doping phenomenon, as well as a method for manufacturing a silicon single crystal thin film.

The inventors focused on the gas composition in the pre-treatment process for removal of the natural oxide film and investigated methods which could remove the natural oxide film at low temperatures, causing minimum roughness of the surface. As a result, it became clear that a highly reducing atmosphere was necessary. The inventors discovered that a method in which the temperature is left low and the surface of a silicon single crystal is exposed to a mixed gas of hydrogen fluoride gas and hydrogen gas is a method which does not cause surface roughness on the silicon single crystal and exhibits superior reproducibility of the removal of the natural oxide film and superior stability of the removal rate, thus completing the present invention.

The first aspect of the present invention provides a method for treating a surface of a silicon single crystal in which the surface of a silicon single crystal is exposed to a mixed gas of hydrogen fluoride gas and hydrogen gas at 0° C.–100° C. to remove the natural oxide film formed on the surface of said silicon single crystal.

Preferably, the duration of time for which the surface of said silicon single crystal is exposed to said mixed gas at 0° C.–100° C. is 0.5–3 minutes.

Preferably, the thickness of the natural oxide film formed on the surface of said silicon single crystal is adjusted to be 10 angstroms or less before the surface of said silicon single crystal is exposed to said mixed gas at 0° C.–100° C.

Another aspect of the present invention provides a method for treating a surface of a silicon single crystal shown above wherein, after the surface of said silicon single crystal is exposed to said mixed gas at 0° C.–100° C., the surface of said silicon single crystal is exposed to an atmosphere containing 20–80% humidity, and then the surface of said silicon single crystal is again exposed to the mixed gas of hydrogen fluoride gas and hydrogen gas at 0° C.–100° C.

Further aspect of the present invention provides a method for manufacturing a silicon single crystal thin film in which, after the natural oxide film formed on the surface of a silicon single crystal is removed by the surface treatment method for a silicon single crystal shown above, a silicon single crystal thin film is grown on said silicon single crystal while the hydrogen gas atmosphere is maintained.

According to the present invention, only the natural oxide film covering the surface of a silicon single crystal is removed quickly without acting on the surface of the silicon single crystal, so that it can expose the surface of the silicon single crystal without causing surface roughness on the silicon single crystal. Also, when the surface of the silicon single crystal is exposed to hydrogen fluoride gas in a hydrogen gas atmosphere, there are fewer fluorine terminations compared with when a nitrogen atmosphere is used, and the integrity of the hydrogen terminations can be increased. When there are many fluorine terminations on the surface of a silicon single crystal, silicon cannot grow as a single crystal and a poly-crystal film is formed on the surface of the silicon single crystal.

The present invention allows the removal of the natural oxide film at low temperatures and therefore the outward diffusion of dopants and auto-doping do not occur. Also, since the natural oxide film can be removed in a very short surface can be suppressed by using hydrogen fluoride gas in a hydrogen gas atmosphere, a very smooth surface can be obtained after the removal of the natural oxide film, resulting in a very preferable condition for the growth of a silicon single crystal thin film.

EMBODIMENTS

Figure 1:
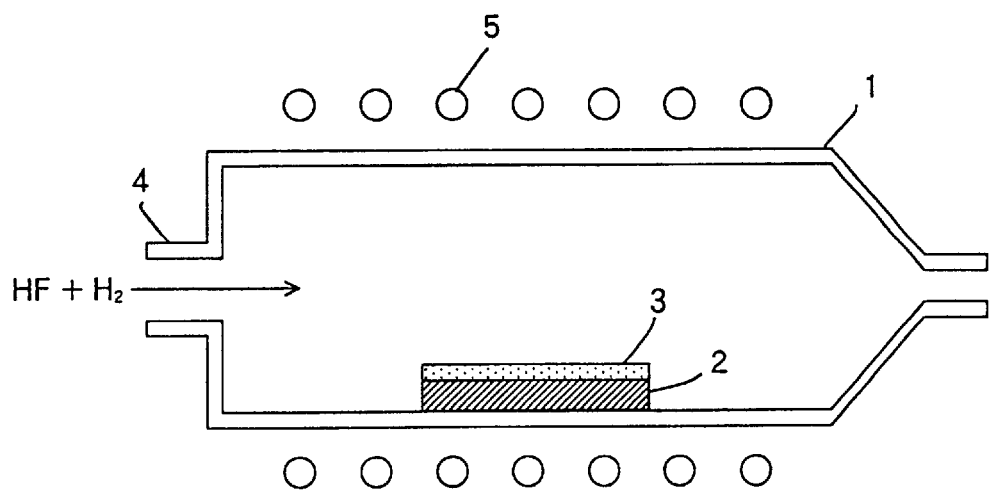
FIG. 1 is a schematic cross section which shows an example of an apparatus used to implement a method of the present invention.

In order to implement the method of the present invention, an apparatus shown in FIG. 1, for example, is used. A silicon single crystal substrate 2 on whose surface the natural oxide film 3 composed of silicon dioxide has formed is placed in a quartz glass reactor vessel 1, and a mixed gas obtained by pre-mixing hydrogen fluoride gas and hydrogen gas is introduced through an inlet 4 of the reactor vessel so that the surface of silicon single crystal substrate 2 is exposed to and contacts the mixed gas at 0° C.–100° C. As a result, natural oxide film 3 on the surface of silicon single crystal substrate 2 is removed by the hydrogen fluoride. This is a very simple and reliable method.

EXAMPLES

Examples of using the apparatus shown in FIG. 1 to expose the surface of silicon single crystal substrate 2 to a mixed gas of hydrogen gas and hydrogen fluoride gas so as to remove the natural oxide film are described below.

Example 1

A silicon single crystal substrate 2 on which a natural oxide film 3 with a thickness of 15 angstroms has formed was placed in a reactor vessel 1 and a 1.0% hydrogen fluoride-hydrogen mixed gas prepared by mixing 49.5 liters per minute of hydrogen gas and 0.5 liter per minute of hydrogen fluoride anhydride gas was introduced into reactor vessel 1 to expose the surface of silicon single crystal substrate 2 to said mixed gas at room temperature, namely 23° C. After this, the thickness of natural oxide film 3 on the surface of silicon single crystal substrate 2 was measured by means of ellipsometry. In the present invention, room temperature stands for a temperature within the range of annual fluctuations of a room without temperature control, specifically a temperature in the range of 0–35° C.

Figure 2:
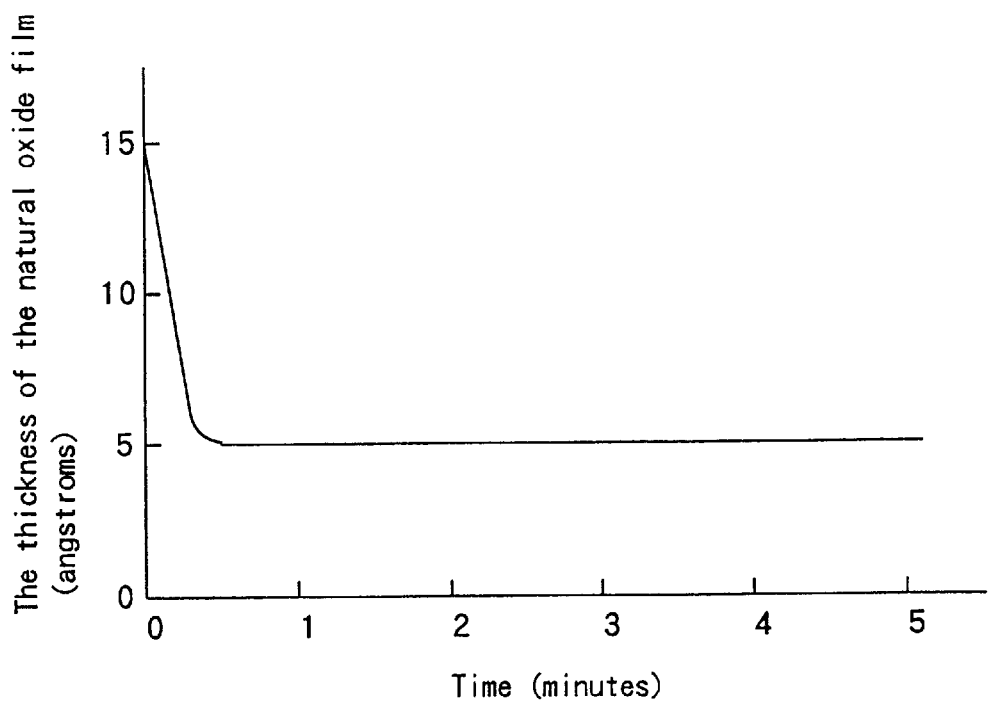
FIG. 2 is a graph which shows the residual thickness of the natural oxide film after the natural oxide film is removed from a silicon single crystal substrate, on whose surface the natural oxide film has formed, by exposing it to hydrogen fluoride-hydrogen mixed gas.

FIG. 2 shows a relationship between the duration of time of exposure to the aforementioned mixed gas and the thickness of natural oxide film 3. Natural oxide film 3 initially had a thickness of 15 angstroms and, after approximately 0.5 minutes of exposure to the mixed gas, approximately 10 angstroms were removed and 5 angstroms of natural oxide film 3 remained. After this, the treatment continued until the exposure time reached 10 minutes but the removal of natural oxide film 3 did not proceed any further.

Once the hydrogen fluoride-hydrogen mixed gas is introduced, it takes only 0.5 minutes or less from the beginning to the end of the removal of natural oxide film 3 when the process is fast. However, since there is some delay before the removal of natural oxide film 3 starts, it requires more than 0.5 minutes for the removal of natural oxide film 3 on the whole surface of silicon single crystal substrate 2 to proceed. On the other hand, it has become clear that continuing for more than 3 minutes is meaningless because the removal of natural oxide film 3 does not proceed any more if it is continued more than 3 minutes. Therefore, it is concluded that the range of 0.5–3 minutes is appropriate for the removal of natural oxide film 3 from the surface of silicon single crystal substrate 2 using the hydrogen fluoride-hydrogen mixed gas. When exposure to the hydrogen fluoride-hydrogen mixed gas continued for 10 minutes, no surface roughness was observed on the surface of silicon single crystal substrate 2.

Comparative Example 1

For the ambient gas in the mixed gas, hydrogen gas was replaced by nitrogen, argon or helium, each of which was used to prepare a mixed gas containing 1.0% hydrogen fluoride. A silicon single crystal substrate 2 was exposed to each of these hydrogen fluoride containing mixed gases in the same manner as in Example 1. For each mixed gas, the removal rate of natural oxide film 3 and the surface condition of silicon single crystal substrate 2 were checked. As a result, as far as the removal rate of natural oxide film 3 was concerned, no significant differences were observed between the case where the ambient gas was hydrogen gas and the cases where the ambient gas was one of other gases. However, the surface condition of silicon single crystal substrate 2 was greatly different compared with when the hydrogen ambient gas was used. When nitrogen, argon or helium was used for the ambient gas, haziness of the surface became conspicuous and an increase in fine unevenness, compared with before the removal of natural oxide film 3, was observed.

As shown above, the surface condition of silicon single crystal substrate 2 deteriorates when the aforementioned inert gases are used for the ambient gas whereas the surface condition is good when hydrogen is used for the ambient gas. The reason for this is believed to be as follows.

In reality, hydrogen gas, nitrogen gas, argon gas and helium gas always contain moisture, although the amount is minute. This moisture promotes the corrosiveness of hydrogen fluoride and accelerates the removal of natural oxide film 3. Moreover, the moisture also oxidizes the silicon surface which emerges after the removal of natural oxide film 3. That is, since the silicon surface which is exposed by the removal of natural oxide film 3 is very active, it is oxidized by the moisture in the ambient gas and forms an oxide film. The oxide film thus formed is then removed by hydrogen fluoride, resulting in places where erosion of the silicon surface proceeds quickly.

Since gases such as nitrogen, argon and helium are inert, they cannot suppress the oxidizing action of the moisture even when the amount of the moisture mixed in is minute. On the other hand, hydrogen gas is reducing and therefore it can suppress the oxidizing power of the moisture which is mixed in and retain a reducing atmosphere. Therefore, when the removal of natural oxide film 3 is conducted by mixing hydrogen fluoride in hydrogen gas, the surface is kept in a good condition, which is an advantage.

Example 2

Hydrogen fluoride-hydrogen mixed gases with different concentrations of hydrogen fluoride gas were prepared and the rest of the procedure was conducted in the same manner as in Example 1 to expose silicon single crystal substrate 2 to the hydrogen fluoride-hydrogen mixed gas. The removal rate of natural oxide film 3 and the surface condition of silicon single crystal substrate 2 were checked for each concentration of hydrogen fluoride gas in the mixed gas. As a result, when the concentration of hydrogen fluoride gas in the mixed gas was less than 0.5%, the removal of natural oxide film 3 did proceed but the stability of the removal rate decreased. Therefore it is preferable that the concentration of hydrogen fluoride gas in the mixed gas be 0.5% or more.

Example 3

The reason why the removal of natural oxide film 3 does not proceed any further when the surface of silicon single crystal substrate 2 is exposed to the hydrogen fluoride-hydrogen mixed gas for more than approximately 0.5 minutes is believed to be due to the fact that the moisture which is believed to be adsorbed on the surface of natural oxide film 3 and act as a catalyst for the reaction with hydrogen fluoride is lost as the removal of natural oxide film 3 proceeds. Therefore, it is believed that the removal of natural oxide film 3 will proceed again if the moisture which is lost as the removal of natural oxide film proceeds is supplied adequately.

If silicon single crystal substrate 2 is exposed to the hydrogen fluoride-hydrogen mixed gas in an atmosphere with a temperature higher than 100° C., then the moisture adsorbed on the surface of natural oxide film 3 evaporates completely and cannot act as a catalyst. Therefore, said exposure should preferably be conducted at a temperature of 100° C. or lower, more preferably at room temperature.

Based on the idea that the removal of natural oxide film 3 can proceed if moisture is supplied from the air, the conditions for supplying moisture were investigated. The first time removal of the natural oxide film was conducted by exposing the surface of silicon single crystal substrate 2 to the hydrogen fluoride-hydrogen mixed gas at room temperature according to Example 1. The surface of silicon single crystal substrate 2 was then exposed to clean air with a different humidity at room temperature, followed by a second time removal of the natural oxide film by again exposing the surface of silicon single crystal substrate 2 to the hydrogen fluoride-hydrogen mixed gas at room temperature. The results showed that on occasion the removal of the natural oxide film did not resume when the relative humidity of the clean air was less than 20%. On the other hand, when the relative humidity was above 80% condensation tended to occur which formed water droplet marks on the surface of silicon single crystal substrate 2, resulting in conditions which rendered the surface unusable for the subsequent processes. Therefore, the relative humidity of the clean air in the room should preferably be 20–80%.

Example 4

The first time removal of the natural oxide film was conducted by exposing the surface of silicon single crystal substrate 2 to the hydrogen fluoride-hydrogen mixed gas at room temperature according to Example 1. After the completion of this, silicon single crystal substrate 2 was taken out from the reactor vessel 1 and stored in clean air with a relative humidity of 60% at room temperature for 24 hours. After measuring the thickness of natural oxide film 3 by means of ellipsometry and verifying that it was 5–6 angstroms, silicon single crystal substrate 2 was again inserted in reactor vessel 1 and 1.0% hydrogen fluoride-hydrogen mixed gas was introduced from inlet 4 of reactor vessel 1 for 3 minutes.

After the completion of the second time removal process of natural oxide film 3, the thickness of natural oxide film 3 on the surface of silicon single crystal substrate 2 was measured by means of ellipsometry. The measurement was zero and complete removal of natural oxide film 3 was thus verified. The surface of silicon single crystal substrate 2 was then measured by means of light scattering and it was revealed that the surface was just as smooth as it was before the removal of natural oxide film 3.

Example 5

According to Example 1, the thickness of natural oxide film 3 which is removed by the first time removal process of the natural oxide film is approximately 10 angstroms. Therefore, it is evident that natural oxide film 3 can be completely removed by a single process if the thickness of natural oxide film 3 has been adjusted to be 10 angstroms or less before the removal process of the natural oxide film. A promising method for adjusting the thickness of natural oxide film 3 to 10 angstroms or less in advance is etching with an aqueous solution of hydrogen fluoride.

Silicon single crystal substrate 2 on whose surface natural oxide film 3 had formed was treated with etching using a 5% aqueous solution of hydrogen fluoride for 3 minutes at room temperature to remove natural oxide film 3 and then rinsed with water to terminate the surface of silicon single crystal substrate 2 with hydrogen atoms. This silicon single crystal substrate 2 was stored in clean air at room temperature for approximately one week to have natural oxide film 3 with a thickness of 5–7 angstroms. This silicon single crystal substrate 2 was exposed to the hydrogen fluoride-hydrogen mixed gas according to Example 1, and it was shown by means of ellipometry that natural oxide film 3 was completely removed by exposure for 3 minutes or less.

Example 6

Silicon single crystal substrate 2 from which natural oxide film 3 has been removed using the methods of Examples 1–5 can be used for growing a silicon single crystal thin film and such without being exposed to an atmosphere other than a hydrogen atmosphere. For example, by providing infrared electric lamps 5 outside of reactor vessel 1 and irradiating silicon single crystal substrate 2 with infrared light, it is possible to heat silicon single crystal substrate 2 up to a temperature which is suitable for growing a silicon single crystal thin film. At this point, a silicon raw material compound gas such as trichlorosilane can be mixed with hydrogen gas and introduced into reactor vessel 1 to grow a silicon single crystal thin film on silicon single crystal substrate 2.

This representative example is described in detail below. Silicon single crystal substrate 2 on whose surface natural oxide film 3 had formed was etched with a 0.1% aqueous solution of hydrogen fluoride for three minutes at room temperature, followed by three-minute water rinsing three times. Ellipsometric measurements in advance showed that this would leave natural oxide film 3 with a thickness of 3 angstroms. This natural oxide film 3 would be used as a protective layer and it would keep particles from sticking to the surface of the substrate. This silicon single crystal substrate 2 was placed in reactor vessel 1 and, after expelling the air in reactor vessel 1 using nitrogen gas, a 1.0% hydrogen fluoride-hydrogen mixed gas, prepared by mixing 49.5 liters/minute of hydrogen gas and 0.5 liters/minute of hydrogen fluoride anhydride gas, was introduced into reactor vessel 1 for three minutes. After this treatment, the supply of the hydrogen fluoride anhydride gas was stopped and the flow rate of hydrogen gas was increased to 100 liters/minute.

At this point, a total of forty 2000 watt infrared light bulbs 5 were placed outside of reactor 1 and energized to irradiate infrared light on silicon single crystal substrate 2. The temperature of silicon single crystal substrate 2 was measured using a radiation thermometer and, when the temperature reached 1000° C., 12 grams/minute of trichlorosilane, mixed with hydrogen gas, was fed into reactor vessel 1 and the supply of trichlorosilane was stopped after one minute. Power to infrared light bulbs was turned off and hydrogen gas was expelled with nitrogen gas after lowering the temperature in hydrogen gas.

Silicon single crystal substrate 2 was taken out from reactor vessel 2 and its surface was specular. The light scattering measurement also verified that the surface was very smooth. Also, the light scattering measurement revealed that the thickness of the silicon single crystal thin film formed on the surface of silicon single crystal substrate 2 was approximately one micrometer.

Comparative Example 2

For comparison, after the supply of hydrogen fluoride anhydride gas was stopped in the aforementioned Example 6, hydrogen gas was replaced by dry nitrogen gas and the inside of reactor vessel 1 was maintained at room temperature for three minutes in a nitrogen atmosphere. The hydrogen atmosphere was then restored and the temperature was raised using infrared light bulbs 5 until it reached 1000° C. at which time trichlorosilane was introduced.

After this, silicon single crystal substrate 2 was taken out and observed. Its surface was clouded, indicating that the normal growth of the silicon single crystal thin film did not proceed. Therefore, it is clear that due to contact with a nitrogen gas atmosphere, i.e. the moisture in the nitrogen gas, oxidation of the surface of silicon single crystal substrate 2 proceeds immediately and the surface condition becomes unsuitable for the growth of the silicon single crystal thin film.

Therefore, it has been experimentally verified that, in order to use the effect of Examples 1–5 effectively, it is desirable to grow the silicon single crystal thin film while retaining a hydrogen gas atmosphere as in Example 6.

What is claimed is:

1. A method for treating a surface of a silicon single crystal in which the surface of a silicon single crystal is exposed to a mixed gas of hydrogen fluoride gas and hydrogen gas at 0° C.–100° C. to remove a natural oxide film formed on the surface of said silicon single crystal, wherein after the surface of said silicon single crystal is exposed to said mixed gas, the surface of said silicon single crystal is exposed to an atmosphere containing 20–80% humidity, and then the surface of said silicon single crystal is again exposed to the mixed gas of hydrogen fluoride gas and hydrogen gas.

2. A method for treating a surface of a silicon single crystal of claim 1, wherein the duration of time for which the surface of said silicon single crystal is exposed to said mixed gas at 0° C.–100° C. is 0.5–3 minutes.

3. A method for treating a surface of a silicon single crystal of claim 1, wherein after the surface of said silicon single crystal is exposed to said mixed gas at 0° C.–100° C., the surface of said silicon single crystal is exposed to an atmosphere containing 20–80% humidity, and then the surface of said silicon single crystal is again exposed to the mixed gas of hydrogen fluoride gas and hydrogen gas at 0° C.–100° C.

4. A method for manufacturing a silicon single crystal thin film in which, after the natural oxide film formed on the surface of a silicon single crystal is removed by the surface treatment method for a silicon single crystal of claim 1, a silicon single crystal thin film is grown on said silicon single crystal which the hydrogen gas atmosphere is maintained.

* * * * *